(12) United States Patent
Noujeim

(10) Patent No.: US 10,469,296 B1
(45) Date of Patent: Nov. 5, 2019

(54) FREQUENCY-SCALABLE NLTL-BASED MM-WAVE VECTOR SIGNAL DE-MODULATOR

(71) Applicant: ANRITSU COMPANY, Morgan Hill, CA (US)

(72) Inventor: Karam Noujeim, Los Altos, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 0 days.

(21) Appl. No.: 16/058,958

(22) Filed: Aug. 8, 2018

Related U.S. Application Data

(60) Provisional application No. 62/543,320, filed on Aug. 9, 2017.

(51) Int. Cl.
| | |
|---|---|
| H04L 27/152 | (2006.01) |
| H04L 27/16 | (2006.01) |
| H03D 3/00 | (2006.01) |
| H04L 27/227 | (2006.01) |
| G01R 19/25 | (2006.01) |
| G01R 31/28 | (2006.01) |
| G01R 1/24 | (2006.01) |

(52) U.S. Cl.
CPC ......... *H04L 27/1525* (2013.01); *H03D 3/007* (2013.01); *H04L 27/16* (2013.01); *H04L 27/2273* (2013.01); *G01R 1/24* (2013.01); *G01R 19/2509* (2013.01); *G01R 31/2822* (2013.01)

(58) Field of Classification Search
CPC .. G01R 1/24; G01R 19/2509; G01R 31/2822; H04L 25/00; H03D 2200/006
USPC ......................................................... 375/324
See application file for complete search history.

(56) References Cited

U.S. PATENT DOCUMENTS

| | | | |
|---|---|---|---|
| 5,378,939 A * | 1/1995 | Marsland | H01L 27/0605 |
| | | | 257/E27.012 |
| 5,801,525 A | 9/1998 | Oldfield | |
| 5,812,039 A | 9/1998 | Oldfield | |
| 5,909,192 A | 6/1999 | Finch | |
| 5,977,779 A | 11/1999 | Bradley | |
| 6,049,212 A | 4/2000 | Oldfield | |
| 6,291,984 B1 | 9/2001 | Wong | |

(Continued)

OTHER PUBLICATIONS

"71-76 GHz Millimeter-wave Transceiver System, Revision: 1.2", National Instruments, 2015, 11 pages.

(Continued)

*Primary Examiner* — Leila Malek
(74) *Attorney, Agent, or Firm* — Tucker Ellis LLP

(57) ABSTRACT

An in-phase (I) and quadrature (Q) demodulator includes an input for receiving a signal, a reference frequency source, and a sampler connected with the input. The sampler includes a sampler strobe connected with the reference frequency source, and a non-linear transmission line (NLTL) connected with the sampler strobe. The NLTL receives a strobe signal generated by the sampler strobe and multiplies a frequency of the strobe signal to generate a sampler signal. When the sampler receives a signal from the input, the sampler is configured to generate and output an intermediate frequency (IF) signal using the sampler signal. A splitter of the demodulator separates the IF signal into an in-phase (I) component and a quadrature (Q) component. Mixers receive the I and Q components and generate I and Q output signals shifted 90° in phase.

16 Claims, 3 Drawing Sheets

(56) References Cited

U.S. PATENT DOCUMENTS

| | | |
|---|---|---|
| 6,316,945 B1 | 11/2001 | Kapetanic |
| 6,331,769 B1 | 12/2001 | Wong |
| 6,496,353 B1 | 12/2002 | Chio |
| 6,504,449 B2 | 1/2003 | Constantine |
| 6,509,821 B2 | 1/2003 | Oldfield |
| 6,525,631 B1 | 2/2003 | Oldfield |
| 6,529,844 B1 | 3/2003 | Kapetanic |
| 6,548,999 B2 | 4/2003 | Wong |
| 6,650,123 B2 | 11/2003 | Martens |
| 6,665,628 B2 | 12/2003 | Martens |
| 6,670,796 B2 | 12/2003 | Mori |
| 6,680,679 B2 | 1/2004 | Stickle |
| 6,700,366 B2 | 3/2004 | Truesdale |
| 6,700,531 B2 | 3/2004 | Abou-Jaoude |
| 6,714,898 B1 | 3/2004 | Kapetanic |
| 6,766,262 B2 | 7/2004 | Martens |
| 6,832,170 B2 | 12/2004 | Martens |
| 6,839,030 B2 | 1/2005 | Noujeim |
| 6,882,160 B2 | 4/2005 | Martens |
| 6,888,342 B2 | 5/2005 | Bradley |
| 6,894,581 B2 | 5/2005 | Noujeim |
| 6,917,892 B2 | 7/2005 | Bradley |
| 6,928,373 B2 | 8/2005 | Martens |
| 6,943,563 B2 | 9/2005 | Martens |
| 7,002,517 B2 | 2/2006 | Noujeim |
| 7,011,529 B2 | 3/2006 | Oldfield |
| 7,016,024 B2 | 3/2006 | Bridge |
| 7,019,510 B1 | 3/2006 | Bradley |
| 7,054,776 B2 | 5/2006 | Bradley |
| 7,068,046 B2 | 6/2006 | Martens |
| 7,088,111 B2 * | 8/2006 | Noujeim .............. G01R 27/32 324/638 |
| 7,108,527 B2 | 9/2006 | Oldfield |
| 7,126,347 B1 | 10/2006 | Bradley |
| 7,284,141 B2 | 10/2007 | Stickle |
| 7,304,469 B1 | 12/2007 | Bradley |
| 7,307,493 B2 | 12/2007 | Feldman |
| 7,509,107 B2 | 3/2009 | Bradley |
| 7,511,496 B2 | 3/2009 | Schiano |
| 7,511,577 B2 | 3/2009 | Bradley |
| 7,521,939 B2 | 4/2009 | Bradley |
| 7,545,151 B2 | 6/2009 | Martens |
| 7,683,602 B2 | 3/2010 | Bradley |
| 7,683,633 B2 | 3/2010 | Noujeim |
| 7,705,582 B2 | 4/2010 | Noujeim |
| 7,746,052 B2 | 6/2010 | Noujeim |
| 7,764,141 B2 | 7/2010 | Noujeim |
| 7,872,467 B2 | 1/2011 | Bradley |
| 7,924,024 B2 | 4/2011 | Martens |
| 7,957,462 B2 | 6/2011 | Aboujaoude |
| 7,983,668 B2 | 7/2011 | Tiernan |
| 8,027,390 B2 | 9/2011 | Noujeim |
| 8,058,880 B2 | 11/2011 | Bradley |
| 8,145,166 B2 | 3/2012 | Barber |
| 8,156,167 B2 | 4/2012 | Bradley |
| 8,159,208 B2 | 4/2012 | Brown |
| 8,169,993 B2 | 5/2012 | Huang |
| 8,185,078 B2 | 5/2012 | Martens |
| 8,278,944 B1 | 10/2012 | Noujeim |
| 8,294,469 B2 | 10/2012 | Bradley |
| 8,305,115 B2 | 11/2012 | Bradley |
| 8,306,134 B2 | 11/2012 | Martens |
| 8,410,786 B1 | 4/2013 | Bradley |
| 8,417,189 B2 | 4/2013 | Noujeim |
| 8,457,187 B1 | 6/2013 | Aboujaoude |
| 8,493,111 B1 | 7/2013 | Bradley |
| 8,498,582 B1 | 7/2013 | Bradley |
| 8,593,158 B1 | 11/2013 | Bradley |
| 8,629,671 B1 | 1/2014 | Bradley |
| 8,630,591 B1 | 1/2014 | Martens |
| 8,666,322 B1 | 3/2014 | Bradley |
| 8,718,586 B2 | 5/2014 | Martens |
| 8,760,148 B1 | 6/2014 | Bradley |
| 8,816,672 B1 | 8/2014 | Bradley |
| 8,816,673 B1 | 8/2014 | Barber |
| 8,884,664 B1 | 11/2014 | Bradley |
| 8,903,149 B1 | 12/2014 | Noujeim |
| 8,903,324 B1 | 12/2014 | Bradley |
| 8,942,109 B2 | 1/2015 | Dorenbosch |
| 9,103,856 B2 | 8/2015 | Brown |
| 9,103,873 B1 | 8/2015 | Martens |
| 9,176,174 B1 | 11/2015 | Bradley |
| 9,176,180 B1 | 11/2015 | Bradley |
| 9,210,598 B1 | 12/2015 | Bradley |
| 9,239,371 B1 | 1/2016 | Bradley |
| 9,287,604 B1 | 3/2016 | Noujeim |
| 9,331,633 B1 | 5/2016 | Robertson |
| 9,366,707 B1 | 6/2016 | Bradley |
| 9,455,792 B1 | 9/2016 | Truesdale |
| 9,560,537 B1 | 1/2017 | Lundquist |
| 9,571,142 B2 | 2/2017 | Huang |
| 9,588,212 B1 | 3/2017 | Bradley |
| 9,594,370 B1 | 3/2017 | Bradley |
| 9,606,212 B1 | 3/2017 | Martens |
| 9,696,403 B1 | 7/2017 | Elder-Groebe |
| 9,733,289 B1 | 8/2017 | Bradley |
| 9,753,071 B1 | 9/2017 | Martens |
| 9,768,892 B1 | 9/2017 | Bradley |
| 9,860,054 B1 | 1/2018 | Bradley |
| 9,964,585 B1 | 5/2018 | Bradley |
| 9,967,085 B1 | 5/2018 | Bradley |
| 9,977,068 B1 | 5/2018 | Bradley |
| 10,003,453 B1 | 6/2018 | Bradley |
| 10,006,952 B1 | 6/2018 | Bradley |
| 10,064,317 B1 | 8/2018 | Bradley |
| 10,116,432 B1 | 10/2018 | Bradley |
| 2006/0250135 A1 | 11/2006 | Buchwald |
| 2007/0273458 A1 * | 11/2007 | Pepper .............. G01R 1/24 333/167 |
| 2010/0330944 A1 * | 12/2010 | Martens .............. G01R 27/32 455/258 |
| 2011/0037667 A1 | 2/2011 | Varjonen |
| 2016/0050032 A1 | 2/2016 | Emerson |

OTHER PUBLICATIONS

"802.11ad Integrated RF Test Solution—Data Sheet", Keysight Technologies, published Feb. 3, 2017, 13 pages.

"Cobaltfx mm-Wave VNA Test & Measurement Solution", Farran Technology, http://www.farran.com/shop/fev_fx/, 5 pages.

Noujeim, et al. "Reduced-Complexity E-Band VNAs with Tethered Far-Reaching Reflectometers", Proceedings of the 46th European Microwave Conference, Oct. 4-6, 2016, 4 pages.

Roberts, et al. "A Compact, Tethered E-Band VNA Reflectometer", 2016 IEEE MTT-S International Microwave Symposium (IMS), May 22-27, 2016, 3 pages.

"Vector Network Analyzer Extenders", http://vadiodes.com/en/products/vector-network-analyzer-extension-modules, 7 pages.

"VectorStar Broadband VNA: ME7838A/E/D", Anritsu Company, https://www.anritsu.com/en-US/test-measurement/products/me7838a, 3 pages.

"VNA Extension Modules", https://www.omlinc.com/products/vna-extension-modules, 2016, 3 pages.

* cited by examiner

FREQUENCY-SCALABLE NLTL-BASED MM-WAVE VECTOR SIGNAL DE-MODULATOR

CLAIM OF PRIORITY

This application claims the benefit of priority to U.S. Provisional application titled "FREQUENCY-SCALABLE NLTL-BASED MM-WAVE VECTOR SIGNAL DE-MODULATOR", Application No. 62/543,320, filed Aug. 9, 2017, which application is herein incorporated by reference.

TECHNICAL FIELD

The present invention relates in general to measuring instruments, and in particular to vector signal analyzers and devices and methods for generating in-phase and quadrature signal measurements.

BACKGROUND

Radio frequency (RF) signals from the millimeter (mm)-wave spectrum (e.g. V Band, E Band, W Band, etc.) have been in use in military applications as well as a growing number of consumer applications. For example, automotive electronic safety systems, such as collision-avoidance radar systems, operate at frequencies from the mm-wave spectrum. Further, the allocation of mm-wave bands for upcoming fifth-generation (5G) cellular wireless communications systems is expected to vastly increase the use of available wide bandwidths in support of communications and entertainment services to be offered to consumers by service providers. Testing these higher-frequency mm-wave systems requires suitable test equipment with not only sufficient frequency range but also sufficient acquisition bandwidth.

A vector signal analyzer is an instrument that measures the magnitude and phase of an input signal at a frequency within the intermediate frequency (IF) bandwidth of the instrument. Many measuring instruments, such as vector signal analyzers, employ a quadrature demodulator that provides an in-phase (I) signal and a quadrature (Q) signal that are exactly 90° out of phase. The I and Q signals are vector quantities and the amplitude and phase shift of a signal received in response to, for example, to a test signal transmitted to a device under test (DUT) can be calculated based on the I and Q signals. The demodulator generates a sum and difference term for analysis by the vector signal analyzer. However, to generate a usable IF signal, a mm-wave signal received at a transceiver of an instrument must be downconverted.

Existing millimeter (mm)-wave IQ demodulators for vector signal analyzers have many imperfections and are often some combination of expensive, bulky, heavy, unwieldy, or limited in IF/RF bandwidth and physical reach.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Figure 1:
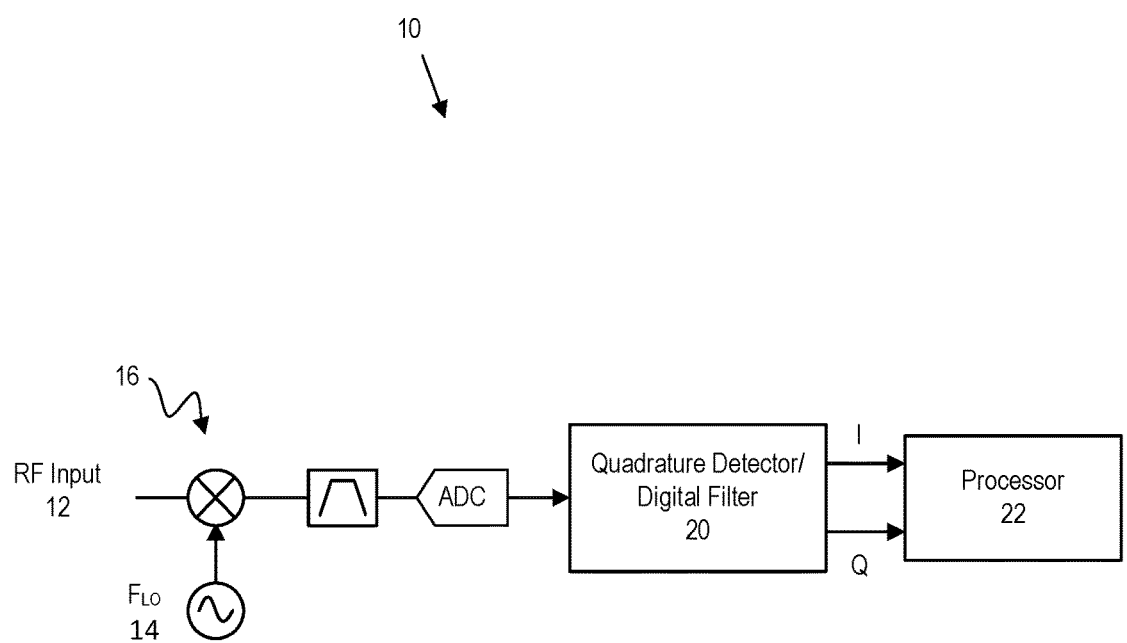
FIG. 1 is a circuit diagram of a vector signal demodulator, in accordance with the prior art.

FIG. 1 illustrates a simplified circuit diagram for a vector signal analyzer 10, in accordance with the prior art. Vector signal analyzers are useful in measuring and demodulating digitally modulated signals to determine the quality of modulation. For example, a vector signal analyzer can be useful for design validation and compliance testing of electronic devices.

The vector signal analyzer operates by first down converting the signal spectra. As shown, the vector signal analyzer uses a down convert stage comprising a fundamental mixer 16 that receives a modulated radio frequency (RF) signal from an input such as an antenna or waveguide and a local oscillator (LO) signal from a voltage-controlled oscillator 14 (i.e., LO generator or signal source) and down converts the RF signal using the LO signal to an intermediate frequency (IF) signal, for example targeting a center frequency of a band-pass filter.

After down conversion, the IF signal is filtered in order to band-limit the signal and prevent aliasing. The IF signal is then digitized using an analog-to-digital converter (ADC). Once the signal is digitized, it is separated into in-phase (I) and quadrature (Q) components using an IQ quadrature detector 20. Several measurements are made by a processor 22 and displayed using the I and Q signal components and digital signal processing (DSP) techniques. For example, a fast Fourier transform (FFT) is used to compute the frequency spectrum of the signal. Error vector magnitude can be computed from a constellation diagram that maps the magnitude of I and Q components to the vertical and horizontal directions, with the error vector magnitude computed as the distance between the ideal and measured constellation points on the diagram.

As applications have grown that make use of signals from the mm-wave spectrum, the need for vector signal analyzers that are capable of demodulating and analyzing input signals having frequencies in the mm-wave range has grown. Current vector signal analyzers that make use of fundamental mixers, such as shown in FIG. 1, require more complex LO chains to down convert the input signals in stages from the much higher frequencies to IF signals usable for demodulation and analysis. The complex LO chains impact the size and complexity of the circuit, increasing the size and cost of the hardware implementation of the vector signal analyzer, as well as increasing the heat dissipated by the vector signal analyzer.

Figure 2:
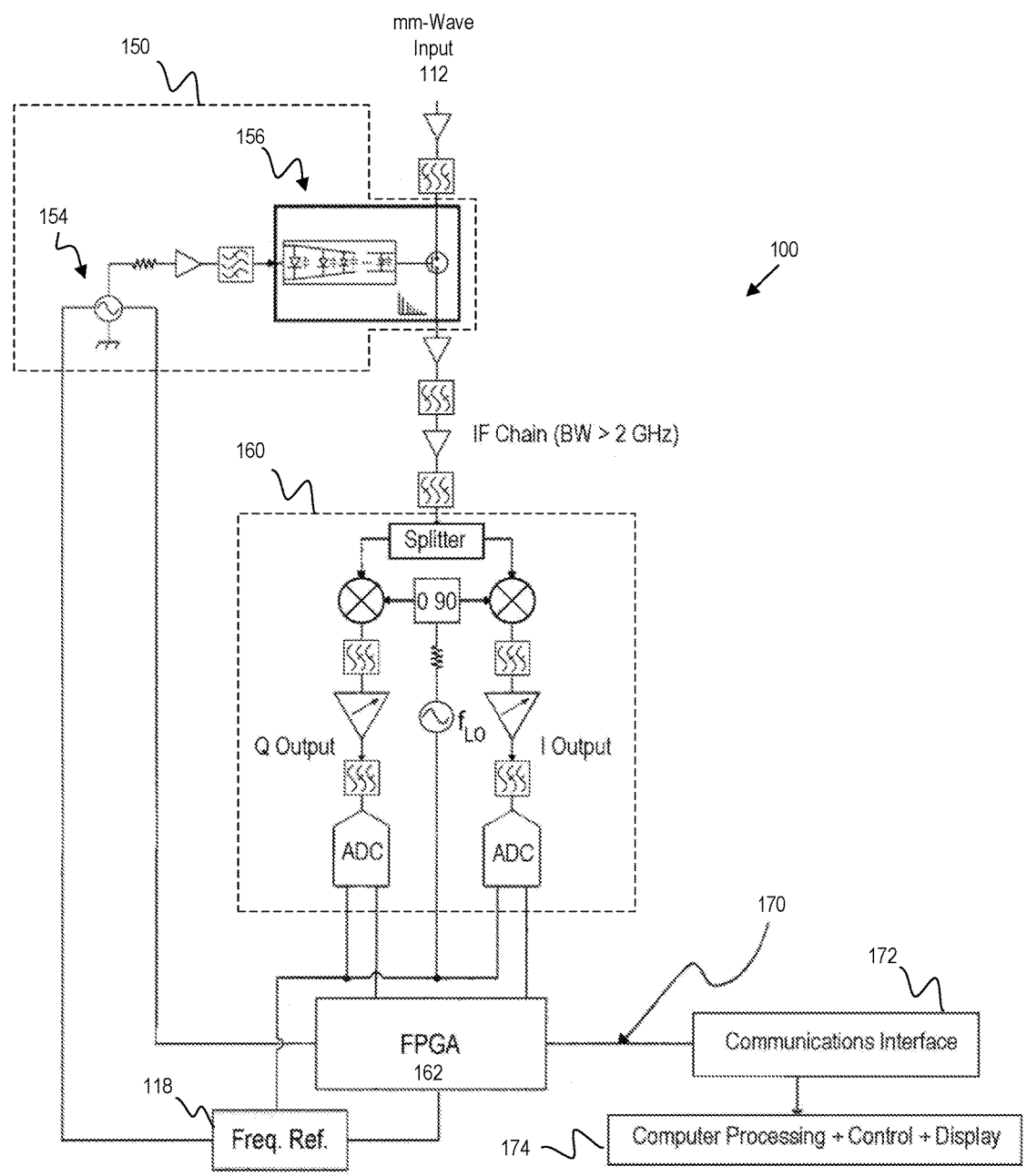
FIG. 2 is a circuit diagram of a frequency-scalable, NLTL-based mm-wave vector signal demodulator, in accordance with an embodiment.
Figure 3:
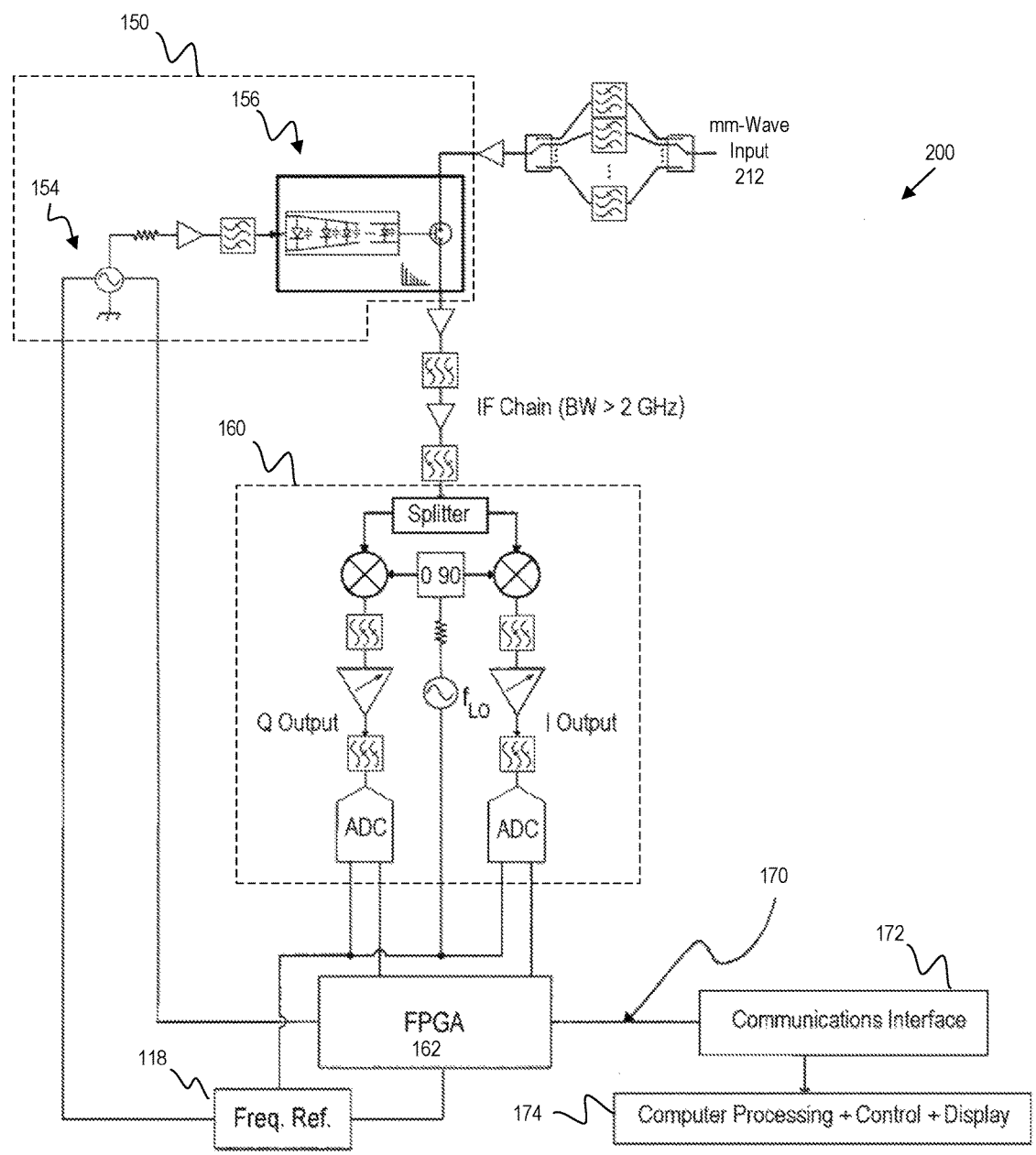
FIG. 3 is a circuit diagram of a frequency-scalable, NLTL-based mm-wave vector signal demodulator, in accordance with another embodiment.

FIGS. 2 and 3 illustrate circuit diagrams comprising a miniature, frequency scalable, ultra-wideband IQ demodulator, in accordance with embodiments. The demodulator includes a non-linear transmission line (NLTL)-driven sampler integrated with a broadband IF chain (>5 GHz) and a direct-conversion receiver. Relative to an entirely mixer-based IQ demodulator, the circuit includes reduced LO-chain complexity, reduced size, reduced heat dissipation and reduced hardware cost.

Unlike existing mixer-based mm-wave IQ demodulators for measuring instruments such as vector signal analyzers, embodiments in accordance with the present invention include a NLTL-based sampling receiver that enables miniaturization of the IQ demodulator while achieving ultra-wideband performance and providing frequency scalability.

Referring to FIG. 2, the demodulator 100 includes an input 112 for receiving mm-wave signals, a reference frequency source 118, and a sampler 150 connected with the input and having a sampler strobe 154 connected with the reference frequency source. The sampler includes a non-linear transmission line (NLTL) 156 comprising a varactor diode-loaded transmission line that includes mm-wave cut-off frequencies allowing sampling of mm-wave signals received, for example in response to transmitted test signals, at very short time intervals. The NLTL receives as input an LO signal from the sampler strobe and multiplies the frequency of the LO signal to mm-wave frequencies.

The input to the demodulator can comprise any input for receiving a mm-wave signal. For example, the input can comprise a waveguide (e.g., a rectangular waveguide), an antenna, a coaxial connector connected with a transmission line, a probe, etc. Sampled signals are mixed with a mm-wave signal generated from the LO signal propagated through the NLTL to generate an IF signal that can be amplified and filtered.

An IF signal chain, for example as shown with a bandwidth greater than 2 GHz, is connected with the sampler to receive a sampled signal. A splitter and digitization portion 160 of the demodulator separates an in-phase (I) component and a quadrature (Q) component of the sampled signal. The I and Q components of the sampled signal are referenced to a reference signal generated by the reference frequency source, with an LO signal source generating an LO signal based on the reference signal that is provided to a pair of mixers that receive, respectively, the I component and the Q component to generate an I output signal and a Q output signal exactly 90° out of phase. The I output signal and the Q output signal are provided to respective analog-to-digital converters (ADC) with digital outputs provided to a processor 162.

In an embodiment, calculations of the amplitude and phase shift of a received signal sampled by the demodulator can be performed, for example, by a field-programmable gate array (FPGA)-based processor. Alternatively, the calculations can be performed by, for example, a general purpose computer, or alternatively by a general-purpose computing on graphics processing units (GPGPU)-based processor. Processing can include the application of fast Fourier transforms (FFTs), demodulation, etc.

In an embodiment, a vector signal analyzer including the demodulator can be connected with an external computer 174 that comprises computer processing and control as well as display. For example, the vector signal analyzer can be connected with a laptop or desktop via a tether 170 connected to a communications interface 172 of the computer.

In a further embodiment, the demodulator can be connected with a measuring instrument via the tether. Such tethers can include scalable-length tethers, such as described in U.S. patent application Ser. No. 16/024,788 entitled "Nonlinear Transmission Line (NLTL)-Based Miniature Reflectometers with Reduced Heat Dissipation and Scalable Tether Length", which is incorporated herein by reference.

FIG. 3 is a circuit diagram for a demodulator 200 in accordance with a further embodiment. The demodulator includes an input 212 for receiving mm-wave signals that is switchable between frequency bands. The input can be switched based on the band of interest and the sampler of the demodulator can generate the appropriate IF signal based on the selected band, for example.

In accordance with embodiments, a frequency-scalable, NLTL-based, vector-signal (IQ) demodulator can be integrated with various measuring instruments, for example, including a vector signal analyzer. In accordance with an embodiment, the NLTL-based demodulator can also be integrated in a measuring instrument for magnitude and phase calibration.

In accordance with embodiments, an NLTL-based demodulator can be used, for example, in instruments targeting transceiver testing, and can be integrated into original equipment manufacturer (OEM) systems. For example, embodiments of NLTL-based demodulators can be integrated with one or more probes for on-wafer testing of transceiver microchips.

In accordance with embodiments, an NLTL-based demodulator can be used in equipment for over-the-air (OTA) measurements. For example, embodiments of a NLTL-based demodulator can be integrated with many different types of antennas including beam steerable antennas, dual polarization antennas, etc. OTA measurements can be used in such applications as power measurement, interference hunting, direction finding, etc. In accordance with an embodiment, the demodulator can comprise two or more RF inputs (e.g. when integrated with dual polarization antennas).

In accordance with an embodiment, multiple miniature, frequency-scalable, NLTL-based, vector-signal (IQ) demodulators can be synchronized in operation.

In accordance with an embodiment, the demodulator can support tethered operation.

Embodiments of NLTL-based demodulators can be used with and integrated into equipment for any application for characterizing mm-wave signals, and should not be limited to those examples provided herein.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMS, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. An in-phase (I) and quadrature (Q) demodulator, comprising:
   an input for receiving a signal into the I and Q demodulator;
   a reference frequency source;
   a sampler connected with the input and including
      a sampler strobe connected with the reference frequency source, and
      a non-linear transmission line (NLTL) connected with the sampler strobe, wherein the NLTL receives a strobe signal generated by the sampler strobe and multiplies a frequency of the strobe signal to generate a sampler signal;
   wherein when the sampler receives the signal from the input, the sampler is configured to generate and output an intermediate frequency (IF) signal using the sampler signal;
   a splitter for separating the IF signal into an in-phase (I) component and a quadrature (Q) component;
   a first mixer that receives the I component and a local oscillator (LO) signal generated based on the reference frequency source and outputs an I output signal; and
   a second mixer that receives the Q components and the LO signal shifted 90° in phase and outputs a Q output signal.

2. The demodulator of claim 1, further comprising:
   a first analog-to-digital converter (ADC) that receives the I output signal and generates a digital I output signal;
   a second ADC that receives the Q output signal and generates a digital Q output signal; and
   a field-programmable gate array (FPGA)-based processor that receives the digital I output signal and the digital Q output signal;
   wherein the FPGA-based processor is configured to apply digital signal processing (DSP) techniques to calculate an amplitude and a phase shift of the signal received at the input.

3. The demodulator of claim 1, further comprising:
   a first analog-to-digital converter (ADC) that receives the I output signal and generates a digital I output signal;
   a second ADC that receives the Q output signal and generates a digital Q output signal; and
   a general-purpose computing on graphics processing units (GPGPU)-based processor that receives the digital I output signal and the digital Q output signal;
   wherein the GPGPU-based processor is configured to apply digital signal processing (DSP) techniques to calculate an amplitude and a phase shift of the signal received at the input.

4. The demodulator of claim 1, wherein the NLTL comprises a varactor diode-loaded transmission line.

5. The demodulator of claim 1, wherein the input is switchable between frequency bands.

6. A vector signal analyzer, comprising;
   a signal transmitter; and
   a receiver having an in-phase (I) and quadrature (Q) demodulator including
      an input,
      a reference frequency source,
      a sampler connected with the input and including
         a sampler strobe connected with the reference frequency source, and
         a non-linear transmission line (NLTL) connected with the sampler strobe, wherein the NLTL receives a strobe signal generated by the sampler strobe and multiplies a frequency of the strobe signal to generate a sampler signal,
      wherein when the sampler receives a signal from the input, the sampler is configured to generate and output an intermediate frequency (IF) signal using the sampler signal,
      a splitter for separating the IF signal into an in-phase (I) component and a quadrature (Q) component,
      a first mixer that receives the I component and a local oscillator (LO) signal generated based on the reference frequency source and outputs an I output signal, and
      a second mixer that receives the Q components and the LO signal shifted 90° in phase and outputs a Q output signal.

7. The vector signal analyzer of claim 6, wherein the receiver further includes
   a first analog-to-digital converter (ADC) that receives the I output signal and generates a digital I output signal,
   a second ADC that receives the Q output signal and generates a digital Q output signal, and
   a field-programmable gate array (FPGA)-based processor that receives the digital I output signal and the digital Q output signal,
   wherein the FPGA-based processor is configured to apply digital signal processing (DSP) techniques to calculate an amplitude and a phase shift of the signal received at the input.

8. The vector signal analyzer of claim 6, wherein the receiver further includes
   a first analog-to-digital converter (ADC) that receives the I output signal and generates a digital I output signal,
   a second ADC that receives the Q output signal and generates a digital Q output signal, and
   a general-purpose computing on graphics processing units (GPGPU)-based processor that receives the digital I output signal and the digital Q output signal,
   wherein the GPGPU-based processor is configured to apply digital signal processing (DSP) techniques to calculate an amplitude and a phase shift of the signal received at the input.

9. The vector signal analyzer of claim 6, wherein the NLTL of the demodulator comprises a varactor diode-loaded transmission line.

10. The vector signal analyzer of claim 6, wherein the input of the receiver is switchable between frequency bands.

11. The vector signal analyzer of claim 7, further comprising a tether connectable with a communication interface of an external computer adapted to display calculations of the vector signal analyzer.

12. The vector signal analyzer of claim 7, further comprising a display for displaying calculations of the vector signal analyzer.

13. A method of measuring an electrical response of a device comprising:
   using a vector signal analyzer including a receiver having a demodulator,
   wherein the demodulator includes
      an input for receiving a signal,
      a reference frequency source,
      a sampler connected with the input and including
         a sampler strobe connected with the reference frequency source, and
         a non-linear transmission line (NLTL) connected with the sampler strobe, wherein the NLTL receives a strobe signal generated by the sampler strobe and multiplies a frequency of the strobe signal to generate a sampler signal, wherein when the sampler receives the signal from the input, the sampler is configured to generate and output an intermediate frequency (IF) signal using the sampler signal, a splitter for separating the IF signal into an in-phase (I) component and a quadrature (Q) component, a first mixer that receives the I component and a local oscillator (LO) signal generated based on the reference frequency source and outputs an I output signal, and a second mixer that receives the Q components and the LO signal shifted 90° in phase and outputs a Q output signal; and receiving the signal from the device at the input of the demodulator; and generating measurement data for the device based on the I output signal and the Q output signal of the demodulator.

14. The method of claim 13, wherein generating measurement data for the device includes calculating an amplitude and a phase shift of the signal received at the input of the demodulator.

15. The method of claim 13, wherein the receiver further includes
a first analog-to-digital converter (ADC) that receives the I output signal and generates a digital I output signal,
a second ADC that receives the Q output signal and generates a digital Q output signal, and
a field-programmable gate array (FPGA)-based processor that receives the digital I output signal and the digital Q output signal,
wherein the FPGA-based processor is configured to apply digital signal processing (DSP) techniques to calculate an amplitude and a phase shift of the signal received at the input.

16. The method of claim 13, further comprising:
connecting the vector signal analyzer to an external computer using a tether; and
displaying, on a display of the external computer, the measurement data for the device.

* * * * *